(12) United States Patent
Gattobigio et al.

(10) Patent No.: US 11,372,339 B1
(45) Date of Patent: Jun. 28, 2022

(54) DEVICE MANUFACTURING METHOD AND COMPUTER PROGRAM

(71) Applicant: ASML NETHERLANDS B.V., Veldhoven (NL)

(72) Inventors: Giovanni Luca Gattobigio, Eindhoven (NL); Pieter Jeroen Johan Emanuel Hoefnagels, Eindhoven (NL); Ronald Frank Kox, Peer (BE); Marcus Johannes Van Der Zanden, Boekel (NL); Maarten Marinus Van Oene, Waalwijk (NL); Jorge Alberto Vieyra Salas, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/603,367

(22) PCT Filed: Feb. 27, 2020

(86) PCT No.: PCT/EP2020/055137
§ 371 (c)(1),
(2) Date: Oct. 13, 2021

(87) PCT Pub. No.: WO2020/212001
PCT Pub. Date: Oct. 22, 2020

(30) Foreign Application Priority Data

Apr. 17, 2019 (EP) ..................................... 19169758

(51) Int. Cl.
*G03F 7/20* (2006.01)

(52) U.S. Cl.
CPC ...... *G03F 7/70525* (2013.01); *G03F 7/70341* (2013.01); *G03F 7/70358* (2013.01)

(58) Field of Classification Search
CPC ............ G03F 7/70525; G03F 7/70341; G03F 7/70358
(Continued)

(56) References Cited

U.S. PATENT DOCUMENTS

| 9,329,491 B2 * | 5/2016 | Grouwstra .......... G03F 7/70775 |
| 2016/0320714 A1 | 11/2016 | Grouwstra et al. |
| 2021/0096471 A1 * | 4/2021 | Eummelen .......... G03F 7/70341 |

FOREIGN PATENT DOCUMENTS

| EP | 1420298 | 5/2004 |
| WO | 99/49504 | 9/1999 |

(Continued)

OTHER PUBLICATIONS

International Search Report and Written Opinion issued in corresponding PCT Patent Application No. PCT/EP2020/055137, dated Jul. 29, 2020.
(Continued)

*Primary Examiner* — Hung V Nguyen
(74) *Attorney, Agent, or Firm* — Pillsbury Winthrop Shaw Pittman LLP (57) ABSTRACT

A device manufacturing method using a lithographic apparatus having a localized immersion system for confining an immersion liquid to a space between a projection system and a substrate to be exposed by the projection system, the method including: predicting a set of first locations on the substrate having a risk of residual liquid from the immersion system when exposed using an initial route for a substrate to expose a plurality of fields thereon; determining a set of modifications to the initial route to reduce the risk of residual loss; test exposing at least one test substrate using the initial route; obtaining a set of second locations of defects in the exposed test substrate; selecting a subset of the set of modifications by comparing the first locations and the sec-
(Continued)

ond locations; and exposing a plurality of production substrates using the initial route modified by the selected subset of modifications.

20 Claims, 7 Drawing Sheets

(58) Field of Classification Search
USPC .................................................... 355/30, 53
See application file for complete search history.

(56) References Cited

FOREIGN PATENT DOCUMENTS

| WO | 2016020121 | 2/2016 |
|----|------------|--------|
| WO | 2017054987 | 4/2017 |
| WO | 2018054658 | 3/2018 |
| WO | 2018108380 | 6/2018 |
| WO | 2018192710 | 10/2018 |

OTHER PUBLICATIONS

Liang, Fu-Jye et al.: "Immersion Defect Reduction, Part I: Analysis of Water Leaks in an Immersion Scanner", Proc. of SPIE, vol. 6520 (Mar. 16, 2007).

* cited by examiner

DEVICE MANUFACTURING METHOD AND COMPUTER PROGRAM

CROSS-REFERENCE TO RELATED APPLICATIONS

This application is the U.S. national phase entry of PCT Patent Application No. PCT/EP2020/055137, which was filed on Feb. 27, 2020, which claims the benefit of priority of European Patent Application No. 19169758.0, which was filed on 17 Apr. 2019 and which is incorporated herein its entirety by reference.

FIELD

The present invention relates to device manufacturing methods, in particular using immersion lithographic apparatus, and to computer programs.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Immersion techniques have been introduced into lithographic systems to enable improved resolution of smaller features. In an immersion lithographic apparatus, a liquid layer of a liquid having a relatively high refractive index is interposed in a space between a projection system of the apparatus (through which the patterned beam is projected towards the substrate) and the substrate. The liquid covers at last the part of the wafer under the final lens element of the projection system. Thus, at least the portion of the substrate undergoing exposure is immersed in the liquid. The effect of the immersion liquid is to enable imaging of smaller features since the exposure radiation will have a shorter wavelength in the liquid than gas. (The effect of the liquid may also be regarded as increasing the effective numerical aperture (NA) of the system and also increasing the depth of focus.)

In commercial immersion lithography, the liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the immersion space as immersion liquid. Other liquids with a high refractive index can be used besides water can be used as the immersion liquid, for example: a hydrocarbon, such as a fluorohydrocarbon; and/ or an aqueous solution. Further, other fluids besides liquid have been envisaged for use in immersion lithography.

In this specification, reference will be made in the description to localized immersion in which the immersion liquid is confined, in use, to the space between the final lens element and a surface facing the final element. The facing surface is a surface of substrate or a surface of the supporting stage (or substrate table) that is co-planar with the substrate surface. (Please note that reference in the following text to surface of the substrate W also refers in addition or in the alternative to a surface of the substrate table, unless expressly stated otherwise; and vice versa). A fluid handling structure present between the projection system and the stage is used to confine the immersion to the immersion space. The space filled by liquid is smaller in plan than the top surface of the substrate and the space remains substantially stationary relative to the projection system while the substrate and substrate table move underneath.

The fluid handling structure is a structure which supplies liquid to the immersion space, removes the liquid from the space and thereby confines liquid to the immersion space. It includes features which are a part of a fluid supply system. The arrangement disclosed in PCT patent application publication no. WO 99/49504 is an early fluid handling structure comprising pipes which either supply or recover liquid from the space and which operate depending on the relative motion of the stage beneath the projection system. In more recent designs of fluid handling structure extends along at least a part of a boundary of the space between the final element of the projection system and the substrate table 60 or substrate W, so as to in part define the space.

It is known that water left on the substrate after an exposure step may cause defects in the devices being manufactured. These defects can arise through at least two mechanisms. Firstly, the water left in contact with the photosensitive layer for an extended period may cause localized chemical or physical changes in the photo-sensitive layer. Secondly, if the meniscus of the immersion liquid confined under the projection system subsequently collides with a droplet of water on the substrate, a bubble may enter the immersion liquid and cause an imaging error.

Models have been developed to predict when immersion liquid might be lost from the liquid confinement system if a given exposure route is carried out. It is then possible to adjust the route to reduce or eliminate the chance of liquid being lost and hence reduce defects caused by lost liquid.

The changes to the exposure route may involve reducing the speed of the substrate during certain maneuvers, extending run-ups before the start of an exposure scan or changing the direction of an exposure scan. In general, changes to the exposure route to reduce the risk of liquid loss increase the length of time taken to complete exposure of the substrate and are therefore often referred to as "slowdowns". Whilst the known method of predicting liquid loss and adjusting the exposure route is very successful in reducing defects, the reduction in throughput caused by the increase in time taken to expose each substrate is undesirable.

SUMMARY

It is desirable, for example, to provide an improved method of reducing defects.

According to an aspect, there is provided a device manufacturing method using a lithographic apparatus having a localised immersion system for confining an immersion liquid to a space between a projection system and a substrate to be exposed by the projection system, the method comprising:

providing an initial route for a substrate to expose a plurality of fields thereon;

predicting a set of first locations on the substrate having a risk of residual liquid from the immersion system when exposed using the initial route;

determining a set of modifications to the initial route to reduce the risk of residual loss;

test exposing at least one test substrate using the initial route;

obtaining a set of second locations of defects in the exposed test substrate;

selecting a subset of the set of modifications by comparing the first locations and the second locations; and exposing a plurality of production substrates using the initial route modified by the selected subset of modifications.

According to an aspect, there is provided a computer program comprising code means that, when executed by a computer system, causes computer system to:

receive an initial route of a substrate for exposing a plurality of fields thereon using a lithographic apparatus having a localised immersion system for confining an immersion liquid to a space between a projections system and a substrate to be exposed by the projection system;

predict a first set of locations on the substrate having a risk of residual liquid from the immersion system;

determine a set of modifications to the initial route to reduce the risk of residual liquid;

obtain a second set of locations of defects in at least one test substrate exposed using the initial route;

select a subset of the set of modifications by comparing the first set of locations and the second set of locations; and determine a modified route for exposing a plurality of production substrates by modifying the initial route by the selected subset of modifications.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
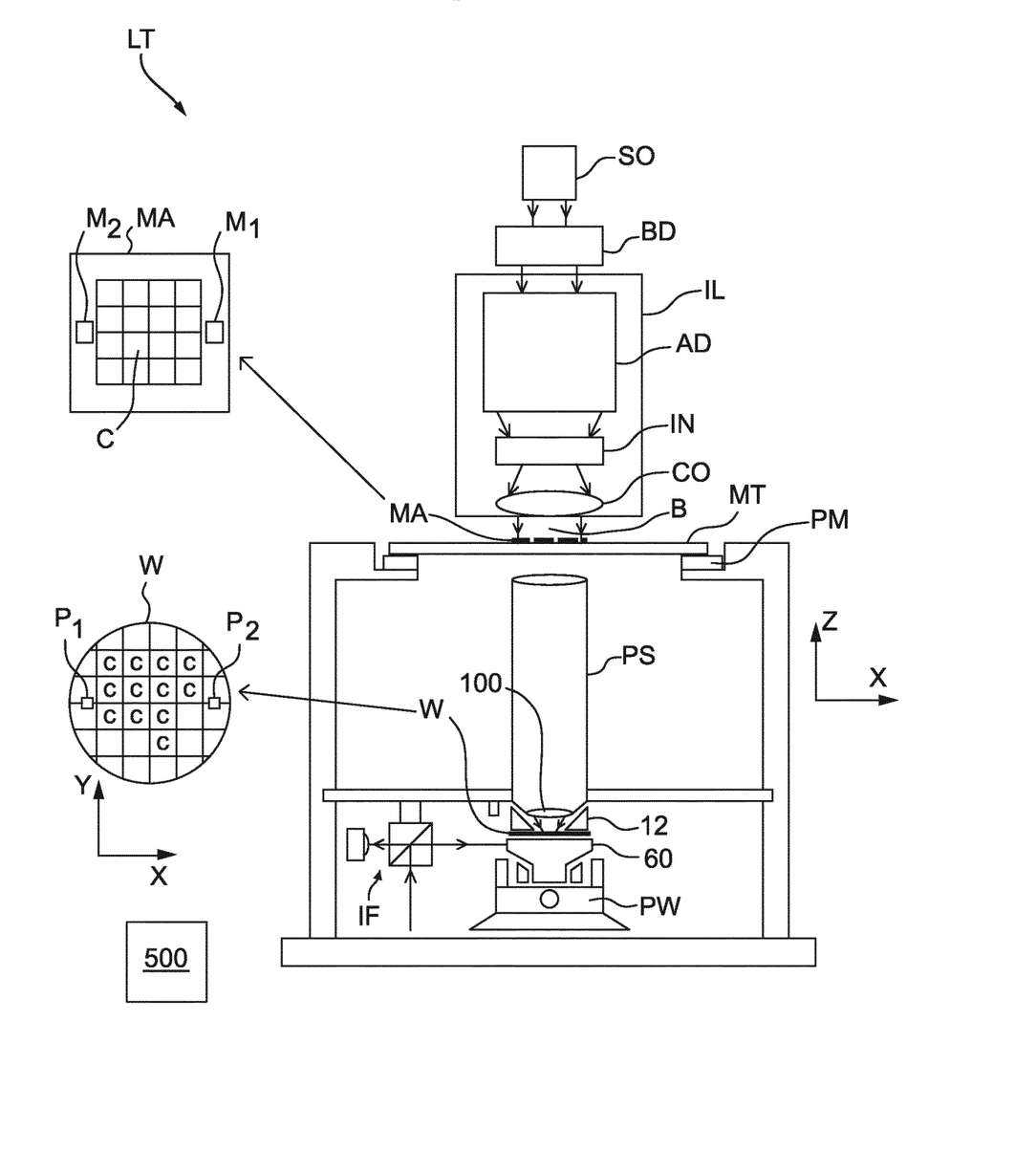
FIG. 1 schematically depicts a lithographic apparatus.

FIG. 1 schematically depicts a lithographic apparatus LT in which an embodiment of the invention can be used. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) 60 or "substrate support" constructed to hold a substrate (e.g. a resist coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as G-outer and G-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table 60 can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table 60 or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. One computer can control multiple lithographic apparatuses. Multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab.

Arrangements for providing liquid between a final lens element 100 of the projection system PS and the substrate can be classed into three general categories. These are the bath type arrangement, the so-called localized immersion systems and the all-wet immersion systems. The present invention relates particularly to the localized immersion systems.

Figure 2:
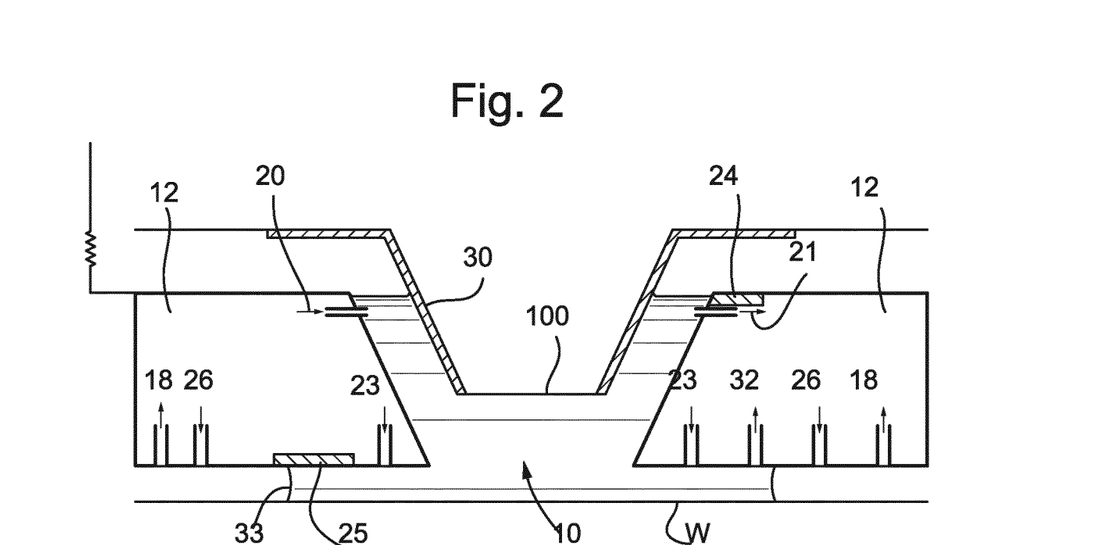
FIG. 2 schematically depicts an immersion liquid confinement structure for use in a lithographic projection apparatus.

In an arrangement which has been proposed for a localized immersion system, a liquid confinement structure 12 extends along at least a part of a boundary of an immersion space between the final lens element of the projection system PS and the facing surface of the stage or table facing the projection system. The facing surface of the table is referred to as such because the table is moved during use and is rarely stationary. Generally, the facing surface of the table is a surface of a substrate W, substrate table 60 which surrounds the substrate or both. Such an arrangement is illustrated in FIG. 2. The arrangement illustrated in FIG. 2 and described below may be applied to the lithographic apparatus described above and illustrated in FIG. 1.

FIG. 2 schematically depicts the liquid confinement structure 12. The liquid confinement structure 12 extends along at least a part of a boundary of the immersion space 10 between the final lens element 100 of the projection system PS and the substrate table 60 or substrate W. In an embodiment, a seal is formed between the liquid confinement structure 12 and the surface of the substrate W/substrate table 60. The seal may be a contactless seal such as a gas seal or a liquid seal and liquid to the immersion space 10. Examples of systems with a gas seal are disclosed in European patent application publication no. EP-A-1,420,298. Liquid is brought into the immersion space 10 by liquid inlet 13. The liquid may be removed by liquid outlet 13.

Figure 3:
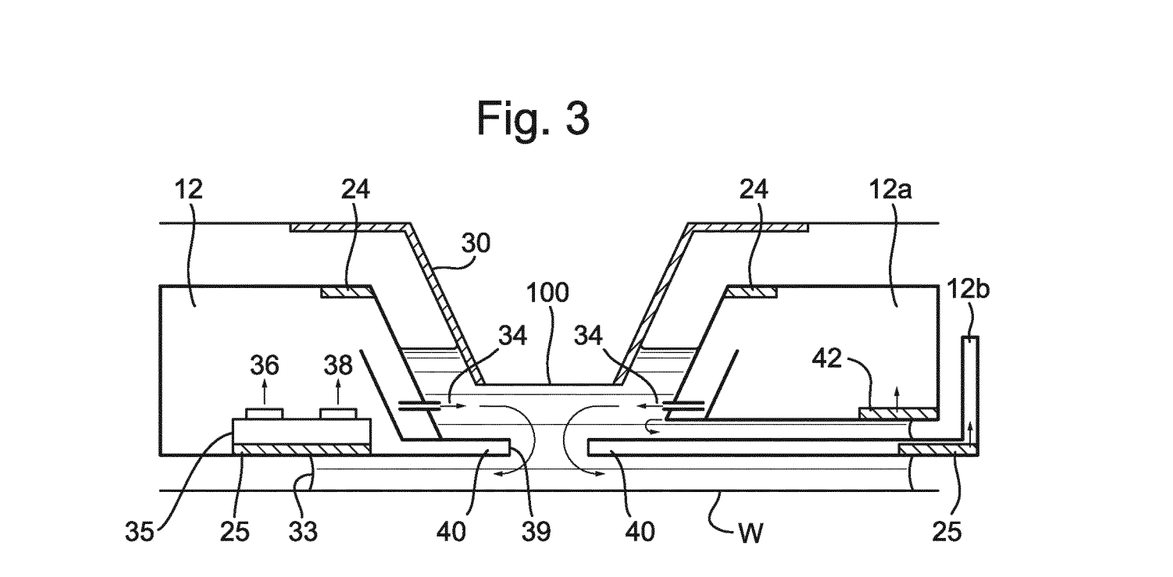
FIG. 3 is a side cross sectional view that schematically depicts a further immersion liquid supply system according to an embodiment.

FIGS. 2 and 3 show different features which may be present in variations of confinement structure 12. The designs may share some of the same features as FIG. 2 unless described differently. The features described herein may be selected individually or in combination as shown or as required.

FIG. 2 shows a confinement structure 12 around the bottom surface of a last lens element. The last lens element 100 has an inverted frustro-conical shape 30. The frustro-conical shape has a planar bottom surface and a conical surface. The frustro-conical shape protrudes from a planar surface and has a bottom planar surface. The bottom planar surface is the optically active portion of the bottom surface of the last lens element, through which the projection beam may pass. The confinement structure surrounds at least part of the frustro-conical shape. The confinement structure has an inner-surface which faces towards the conical surface of the frustro-conical shape. The inner-surface and the conical surface have complementary shape. A top surface of the confinement structure is substantially planar. The confinement structure may fit around the frustro-conical shape of the last lens element. A bottom surface of the liquid confinement structure is substantially planar and in use the bottom surface may be parallel with the facing surface of the table and/or wafer. The distance between the bottom surface and the facing surface may be in the range of 30 to 500 micrometers, desirably in the range of 80 to 200 micrometers.

The confinement structure extends closer to the facing surface of the wafer and wafer table than the last lens element. A space 10 is therefore defined between the inner surface of the confinement structure, the planar surface of the frustro-conical portion and the facing surface. During use, the space is filled with liquid. The liquid fills at least part of a buffer space between the complementary surfaces between lens and the confinement structure, in an embodiment at least part of the space between the complementary inner-surface and the conical surface.

Liquid is supplied to the space through an opening formed in the surface of the liquid confinement structure. The liquid may be supplied through a supply opening 20 in the inner-surface of the liquid confinement structure. Alternatively or additionally, the liquid is supplied from an under supply opening 23 formed in the undersurface of the confinement structure 12. The under supply opening may surround the path of the projection beam and it may be formed of a series of openings in an array. The liquid is supplied to fill the space 10 so that flow through the space under the projection system is laminar. The supply of liquid from the opening 23 under the liquid confinement structure additionally prevents the ingress of bubbles into the space. This supply of liquid functions as a liquid seal.

The liquid may be recovered from a recovery opening 21 formed in the inner-surface. The recovery of the liquid through the recovery opening may be by application of an under pressure; the recovery through the opening 21 as a consequence of the velocity of the liquid flow through the space; or the recovery may be as a consequence of both. The recovery opening 21 may be located on the opposite side of the supply opening 20, when viewed in plan. Additionally or alternatively, the liquid may be recovered through an overflow opening 24 located on the top surface of the liquid confinement structure 12.

Additionally or alternatively, liquid may be recovered from under the liquid confinement structure through a bottom recovery opening 25, 32. The bottom recovery opening may serve to hold (or 'pin') a liquid meniscus to the liquid confinement structure. The meniscus forms between the liquid confinement structure and the facing surface and it serves as border between the liquid space and the gaseous external environment. The bottom recovery opening 25 may be a porous plate 25 which may recover the liquid in a single phase flow. The bottom recovery opening may be a series of pining openings 32 through which the liquid is recovered. The pining openings may recover the liquid in a two phase flow.

Optionally radially outward, with respect to the inner-surface of the liquid confinement structure, is a gas knife opening 26. Gas may be supplied through the gas knife opening at elevated speed to assist confinement of the immersion liquid in the space. The supplied gas may be humidified and it may contain carbon dioxide. The supplied gas may consist essentially of carbon dioxide and water vapor. Radially outward of the gas knife opening is a gas recovery opening 18 for recovering the gas supplied through the gas knife.

Features shown in FIG. 3 which are common to FIG. 2 share the same reference numbers. The confinement structure 12 has an inner surface which complements the conical surface of the frustro-conical shape of the last lens element 100. The undersurface of the confinement structure is closer to the facing surface than the bottom planar surface of the frustro-conical shape.

Liquid is supplied to the space through supply openings formed in the inner surface of the confinement structure. The supply openings 34 are located towards the bottom of the inner surface, perhaps below the bottom surface of the frustro-conical shape. The supply openings are located on the inner surface, spaced apart around the path of the projection beam.

Liquid is recovered from the space 10 through recovery openings 25 in the undersurface of the liquid confinement structure 12. As the facing surface moves under the confinement structure, the meniscus 33 may migrate over the surface of the recovery opening 25 in the same direction as the movement of the facing surface. The recovery openings may be formed of a porous member. The liquid may be recovered in single phase. In an embodiment the liquid is recovered in a two phase flow. The two phase flow is received in a chamber 35 within the liquid confinement structure 12 where it is separated into liquid and gas. The liquid and gas are recovered through separate channels 36, 38 from the chamber 35.

An inner periphery 39 of the undersurface of confinement structure extends into the space away from the inner surface to form a plate 40. The inner periphery forms a small aperture which may be sized to match the shape and size of the projection beam. The plate may serve to isolate liquid either side of it. The supplied liquid flows inwards towards the aperture, through the inner aperture and then under the plate radially outwardly towards the surrounding recovery openings 25.

In an embodiment the confinement structure may be in two parts: an inner part 12a and an outer part 12b. For convenience this arrangement is shown in the right-hand part of FIG. 3. The two parts may move relatively to each other, in a plane parallel to the facing surface. The inner part may have the supply openings 34 and it may have the overflow recovery 24. The outer part 12b may have the plate 40 and the recovery opening 25. The inner part may have an intermediate recovery 42 for recovering liquid which flows between the two parts.

Sometimes, immersion liquid is lost from the liquid confinement system and left on the surface of the substrate. The liquid lost from the liquid confinement system may be referred to herein as residual immersion liquid or residual liquid and may be in the form of a thin film or droplets. The residual immersion liquid can cause manufacturing defects in at least two ways. Firstly, chemical or physical changes in the photo-sensitive layer may be caused by extended contact between the immersion liquid and the photo-sensitive layer. Secondly, if the meniscus of the immersion liquid confined to the space between the substrate and the projection system contacts residual immersion liquid, bubbles may be generated in the immersion liquid and cause imaging errors.

Methods have been proposed to predict where immersion liquid might be lost and where residual immersion liquid might end up as a result of subsequent movements of the substrate. A location may be predicted to have a risk of residual liquid if there is a risk of liquid being lost at that location or a risk of liquid ending up at that location having been lost from the liquid confinement at another location. The predictions of residual liquid are based on an initial route for the substrate to image a given set of fields. A substrate route describes the path taken by the substrate as well as the accelerations and velocities of the substrate at relevant points on the path. A substrate route may also be referred to as a trajectory or meander. The latter term reflects that the successive fields are usually scanned in opposite directions so the path meanders. Predictions of residual liquid may be based on knowledge that certain movements, such as changes of direction and crossing the edge of the substrate, are more likely to cause liquid loss. The model may take into account movements of the substrate after a predicted liquid loss to determine where the lost liquid ends up.

The predictions of liquid loss can be used to determine modifications to the initial route to reduce the risk of liquid loss. The initial route is generally devised to enable imaging of the set of fields in as short a time as possible, in order to maximize throughput (substrates exposed per hour). The modifications to the initial route may include reducing the speed of the substrate for certain parts in the route, changing the direction in which a given field is imaged, extending a run-up or changing the angle of a movement in which the immersion liquid crosses the edge of the substrate. Generally speaking, the modifications will increase the length of time required to image all the fields of a substrate and so are referred to as slowdowns. Methods of predicting liquid loss and determining route modifications are disclosed in US2016/320714A1 and WO2016020121A1, which documents are hereby incorporated by reference in their entirety.

The above methods of predicting liquid loss and determining route modifications are highly effective at reducing defects, which improves yield. However, the proposed route modifications (slowdowns) have significant impact on throughput. The present inventors have determined that the known models may over predict defects so that it may not be necessary to carry out all slowdowns proposed by the model. This is depicted in FIGS. 4A and 4B which depict the results of performing exposures using the same route but with different photo-sensitive layers.

Figure 4A:
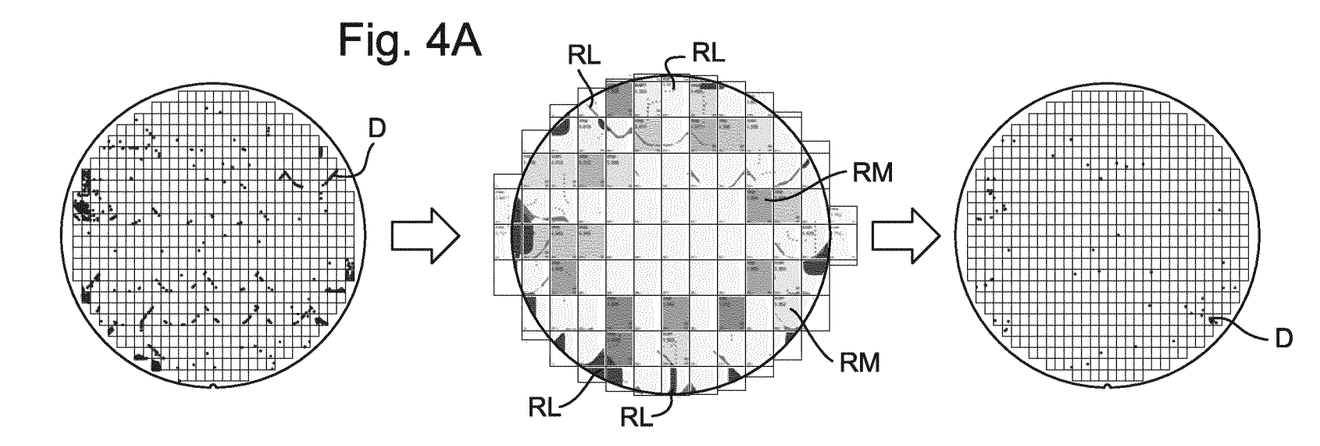
FIGS. 4A and 4B depict the effect of performing slow-downs suggested by a water-loss model when using a high-sensitivity photosensitive layer and a low-sensitivity photosensitive layer.
Figure 4B:
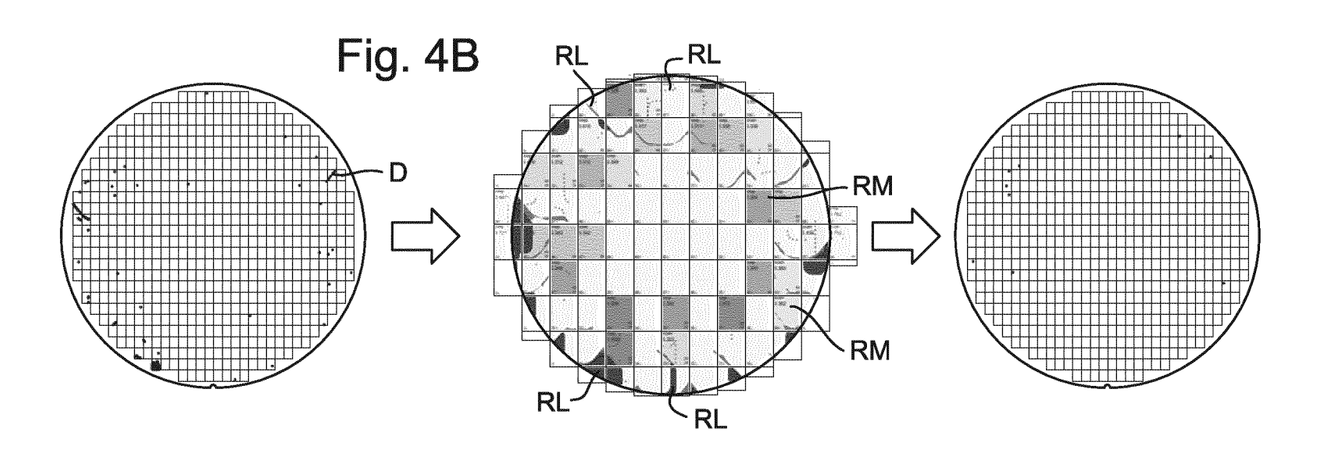

The photo-sensitive layer in FIG. 4A has a high sensitivity to residual liquid whereas that in FIG. 4B has a low sensitivity. On the left in FIGS. 4A and 4B, the locations of defects D occurring when a wafer is exposed with an unmodified ("full speed") route are shown. It can be seen that the high sensitivity substrate exhibits many more defects that the low sensitivity substrate. In the middle are shown the locations of predicted residual liquid RL and route modifications RM to avoid the residual liquid. On the right are shown the locations of defects D occurring when the substrate is exposed with the route modifications applied. It can be seen that in both cases the number of defects is substantially reduced, but in the case of the low sensitivity substrate, the low level of defects occurring when the unmodified route is used suggests that not all of the route modifications where necessary and therefore throughput is unnecessarily reduced by applying unnecessary slowdowns.

However, determining which slowdowns should be performed and which are unnecessary, is not straightforward. Not all defects are due to residual liquid. Also, the probability that an occurrence of residual liquid leads to a defect depends on factors that are not, and in some cases cannot be, taken into account in the algorithm that predicts residual liquid. For example, the exact chemistry of the photosensitive layer and/or any topcoat may affect the probability that liquid left on the substrate for an extended period affects the photosensitive layer. The exact contact angle between the photosensitive layer or any topcoat and the immersion liquid may affect the probability of a bubble entering the immersion liquid when the meniscus collides with a droplet.

The present invention therefore proposes to compare predictions of residual liquid with actual defects experienced in performing exposures using the initial (i.e. unmodified) route. This is illustrated in FIGS. 5A to 5C and 6.

Figure 5A:
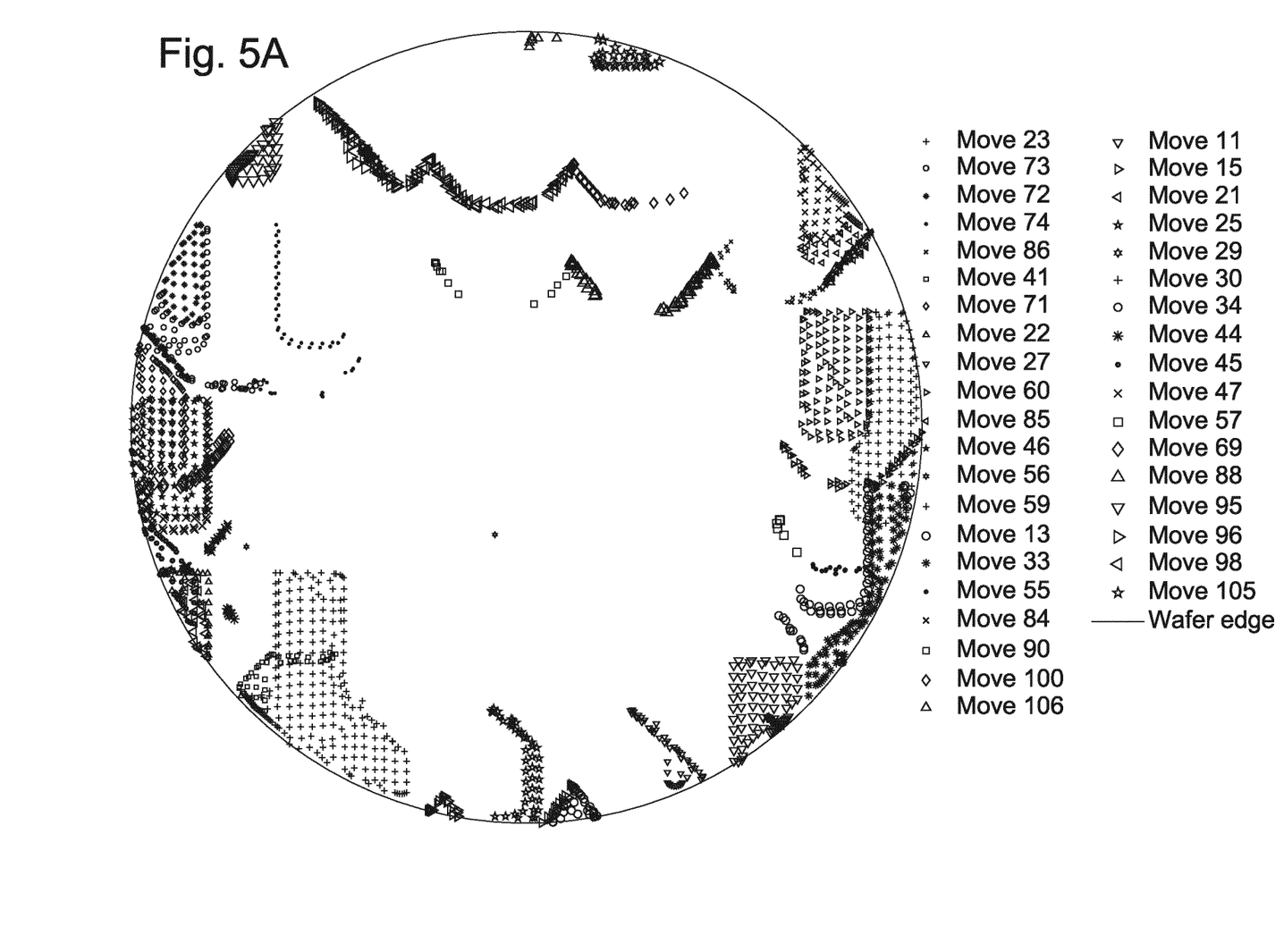
FIGS. 5A to 5C depict a process of matching measured defect data to predicted water-loss.

In a method embodying the invention, the locations of predicted residual liquid when a throughput-optimized (full speed) exposure route is performed are obtained, S1. These are shown in FIG. 5A where the different symbols in the wafer map indicate the associate move in the exposure route as indicated in the key. The full speed exposure route may be referred to as the initial exposure route. It will be appreciated that the "full speed" route does not necessarily involve the substrate being moved at the fastest possible speed at all times but may include speed variations to address other issues. The prediction may be performed by known algorithms as described above.

Figure 5B:
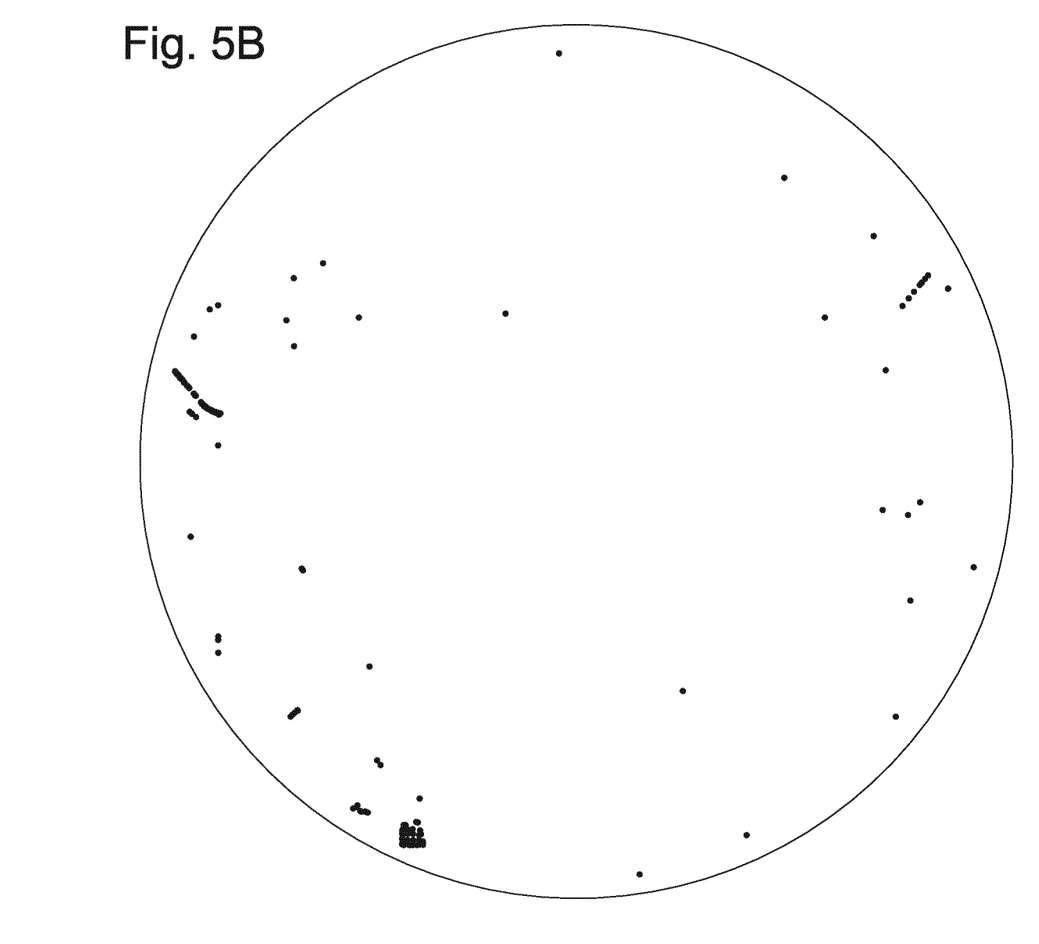

One or more test substrates (e.g. a batch of 25) are exposed S2 using the initial exposure route and defects are detected S3 using known methods. The locations of actual defects detected are shown in FIG. 5B. Where a plurality of test substrates (e.g. up to 25) are exposed and measured, the results may include a probability associated with each defect location. Whilst any suitable technique for detecting defects can be used, in some cases it is advantageous to use a scatterometric technique, e.g. as described in WO2018/192710A1 (which document is hereby incorporated by reference in its entirety). The techniques described therein are capable of identifying defects caused by residual liquid from the lithographic apparatus without the labour intensive process of setting up patterned inspection recipes and performing defect classification.

In some cases it is possible to determine which defects might be related to residual liquid, in which case the liquid-related defects are identified S4 (or, equivalently, non-liquid-related defects are filtered out). One way of determining whether a defect is liquid-related is to determine whether it is within a predetermined distance, e.g. 5 mm, 10 mm or 20 mm, of a location of predicted residual liquid. The distance chosen depends on the accuracy of the model that predicts liquid loss: if the model is more accurate, a smaller distance may be appropriate. If the model predicts areas for liquid loss, a defect may be determined to be liquid-related if it is within an area of predicted liquid-loss. This approach works well if the number of non-liquid-related defects is low compared to the number of liquid-related defects and they are randomly distributed in which case the effect of incorrectly labelling a non-liquid-related defect as liquid-related is not significantly detrimental.

The processes of predicting residual liquid S1 and obtaining defect information S2-S4 may be carried out in parallel or sequentially, in either order. Both processes are carried out for specific layers and specific processes. It may not be necessary to apply the invention to all layers of a device manufacturing process but it is unlikely that results from one layer or process would be applicable in another layer or process.

Figure 5C:
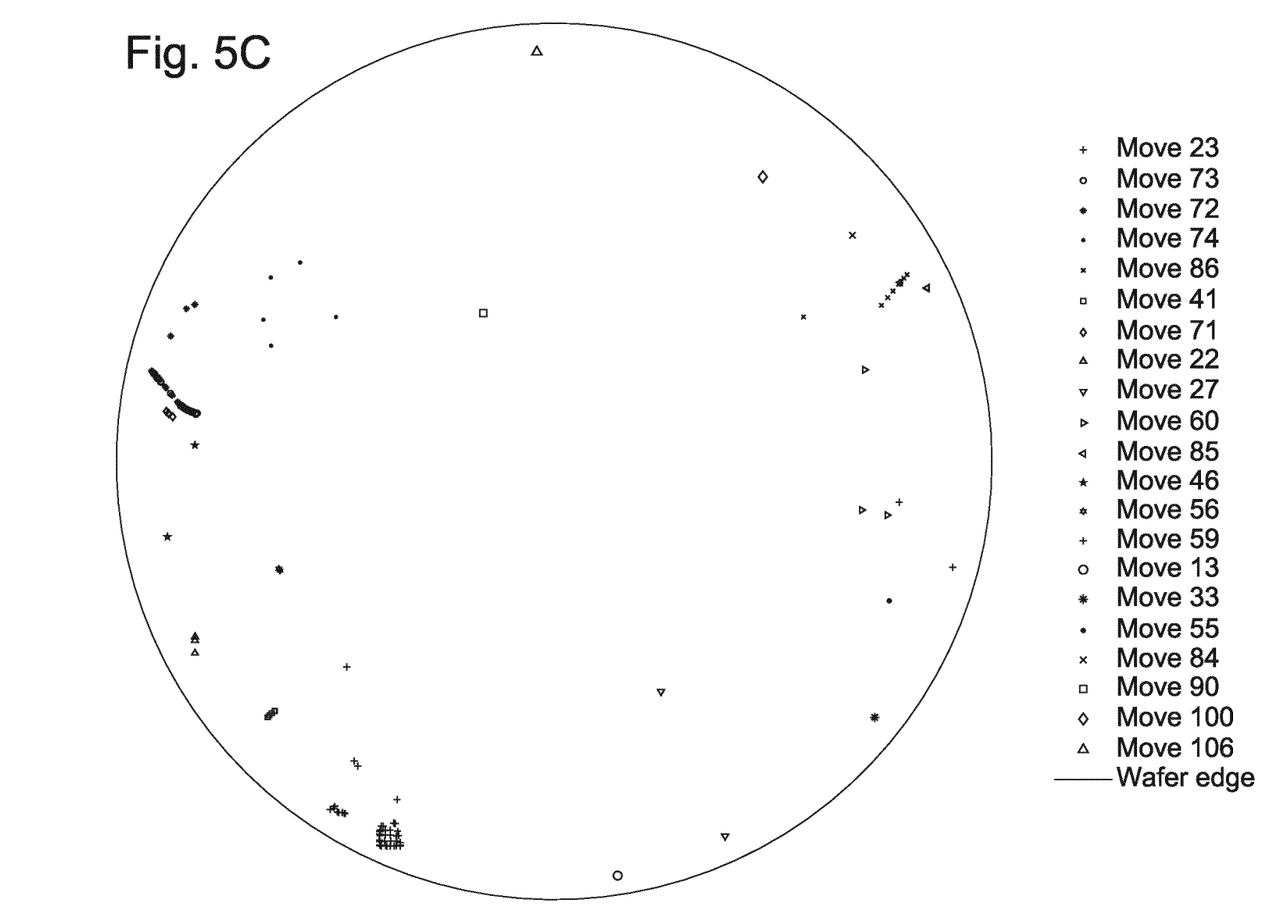
Figure 6:
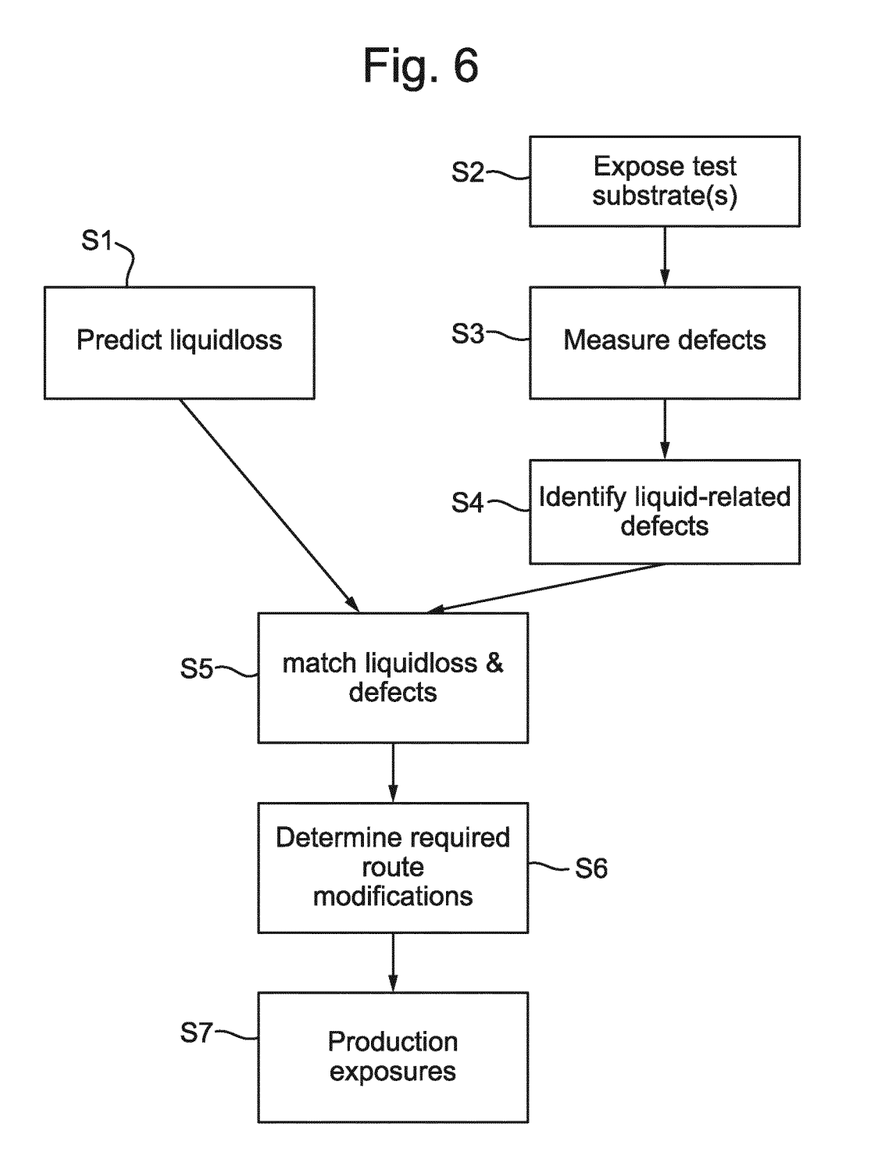
FIG. 6 is a flow chart of a method according to an embodiment of the invention.

Once both locations of residual liquid and locations of defects have been obtained, the next step is to match S5 each defect with the location of an occurrence of residual liquid which is assumed to be the cause of that defect. Filtering out non-liquid-related defects by reference to their distance to a location of residual liquid can be performed at this stage instead of in advance. The results are shown in FIG. 5C, where the symbol at the location of each defect of FIG. 5B indicates the associate modification as indicated by the key.

Given a set of residual liquid locations that are associated with respective defects, it is now possible to identify S6 route modifications (slowdowns) that are expected to prevent those occurrences of residual liquid. If, as discussed above, the number of actual defects is lower than predicted by the residual liquid model, only a subset of the route modifications will be associated with actual defects. Therefore, by applying only the subset of modifications to the initial route to generate a modified route, the reduction of throughput is minimized. It should be noted that the location of a route modification to prevent a given residual liquid occurrence may not be the same as the location of the residual liquid occurrence and defect, since liquid that is lost from the liquid confinement system may be pushed around the substrate (known as the "bulldozer effect"). There is not necessarily a one-to-one relationship between residual liquid occurrences and route modifications. One route modification may prevent multiple residual liquid occurrences and/or multiple route modifications may be required to prevent a single residual liquid occurrence.

In an embodiment, the actual defect data provides information as to the probability of a defect occurring in a given location. Alternatively or in addition, the residual liquid prediction model provides information as to the probability of a residual liquid occurrence in a given location. In this case, the matching process can provide information indicating the probability that a given route modification will prevent a defect, or equivalently the expected number of defects that would be prevented by a given route modification. It is then possible to rank the route modifications in order of their efficacy in preventing defects and to select sufficient route modifications to be applied to the route to reduce the expected number of defects per substrate to a desired amount. In selecting route modifications to apply, it is also possible to take into account the time-cost (i.e. the magnitude of the delay) of each route modification. The present invention therefore allows the user to accurately select a desired compromise between throughput and yield.

Embodiments are provided according to the following clauses:

1. A device manufacturing method using a lithographic apparatus having a localised immersion system for confining an immersion liquid to a space between a projection system and a substrate to be exposed by the projection system, the method comprising:
   providing an initial route for a substrate to expose a plurality of fields thereon;
   predicting a set of first locations on the substrate having a risk of residual liquid from the immersion system when exposed using the initial route;
   determining a set of modifications to the initial route to reduce the risk of residual loss;
   test exposing at least one test substrate using the initial route;
   obtaining a set of second locations of defects in the exposed test substrate;
   selecting a subset of the set of modifications by comparing the first locations and the second locations; and
   exposing a plurality of production substrates using the initial route modified by the selected subset of modifications.

2. A method according to clause 1 wherein each of the modifications is associated with at least one of the first locations and selecting a subset of the set of modifications comprises selecting those modifications for which one of the second locations matches an associated one of the first locations.

3. A method according to clause 2 wherein a second location matches a first location if it is with a predetermined distance of the first location.

4. A method according to clause 3 wherein the predetermined distance is in the range of 10 mm to 20 mm.

5. A method according to any one of the preceding clauses wherein obtaining a set of second locations comprises detecting defects in the exposed test subject and filtering out those defects that are not caused by residual liquid.

6. A method according to any one of the preceding clauses wherein the test exposing comprises exposing a plurality of test substrates and obtaining a set of second locations comprises determining a risk of a defect at each of the second locations.

7. A method according to any one of the preceding clauses wherein selecting a subset of modifications comprises determining an expected number of defects prevented by each modification and selecting modifications associated with the highest expected number of defects prevented.

8. A method according to any one of the preceding clauses wherein obtaining a set of second locations comprises detecting defects using scatterometry.

9. A computer program comprising code means that, when executed by the control system of an apparatus for processing production substrates, causes the apparatus for processing production substrates to perform a method according to any one of clauses 1 to 8.

10. A computer program comprising code means that, when executed by a computer system, causes computer system to:
   receive an initial route of a substrate for exposing a plurality of fields thereon using a lithographic apparatus having a localised immersion system for confining an immersion liquid to a space between a projections system and a substrate to be exposed by the projection system;
   predict a first set of locations on the substrate having a risk of residual liquid from the immersion system;
   determine a set of modifications to the initial route to reduce the risk of residual liquid;
   obtain a second set of locations of defects in at least one test substrate exposed using the initial route;
   select a subset of the set of modifications by comparing the first set of locations and the second set of locations; and
   determine a modified route for exposing a plurality of production substrates by modifying the initial route by the selected subset of modifications.

10. A lithographic apparatus having a localized immersion system for confining an immersion liquid to a space between a projection system and a substrate to be exposed by the projection system, the lithographic apparatus arranged to perform a method according to any one of clauses 1 to 8.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 436, 405, 365, 248, 193, 157 or 126 nm). and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive reflective, magnetic, electromagnetic and electrostatic optical components.

While specific embodiments of the invention have been described above, it will be appreciated that the invention may be practiced otherwise than as described.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides an immersion liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the immersion liquid.

The descriptions above are intended to be illustrative, not limiting. Thus, it will be apparent to one skilled in the art that modifications may be made to the invention as described without departing from the scope of the claims set out below.

The invention claimed is:

1. A device manufacturing method using a lithographic apparatus having a localized immersion system for confining an immersion liquid to a space between a projection system and a substrate to be exposed by the projection system, the method comprising:
  predicting a set of first locations on a substrate having a risk of residual liquid from the immersion system when exposed using an initial route for the substrate to expose a plurality of fields thereon;
  determining a set of modifications to the initial route to reduce the risk of residual liquid;
  obtaining a set of second locations of defects in at least one test substrate exposed using the initial route;
  selecting a subset of the set of modifications by comparing the first locations and the second locations; and
  exposing a plurality of production substrates using the initial route modified by the selected subset of modifications.

2. The method according to claim 1, wherein each of the modifications is associated with at least one of the first locations and selecting a subset of the set of modifications comprises selecting those modifications for which one of the second locations matches an associated one of the first locations.

3. The method according to claim 2, wherein a second location matches a first location if it is within a predetermined distance of the first location.

4. The method according to claim 3, wherein the predetermined distance is in the range of 10 mm to 20 mm.

5. The method according to claim 1, wherein obtaining a set of second locations comprises detecting defects in the exposed test substrate and filtering out those defects that are not caused by residual liquid.

6. The method according to claim 1, wherein obtaining a set of second locations comprises determining a risk of a defect at each of a plurality of second locations from a plurality of exposed test substrates.

7. The method according to claim 1, wherein selecting a subset of modifications comprises determining an expected number of defects prevented by each modification and selecting one or more modifications associated with the highest expected number of defects prevented.

8. The method according to claim 1, wherein obtaining a set of second locations comprises detecting defects using scatterometry.

9. A computer program product comprising a non-transitory computer-readable medium having instructions therein, the instructions, when executed by a computer system, configured to cause the computer system to at least:

receive an initial route of a substrate for exposing a plurality of fields thereon using a lithographic apparatus having a localized immersion system for confining an immersion liquid to a space between a projections system and a substrate to be exposed by the projection system;

predict a first set of locations on the substrate having a risk of residual liquid from the immersion system when exposed using the initial route;

determine a set of modifications to the initial route to reduce the risk of residual liquid;

obtain a second set of locations of defects in at least one test substrate exposed using the initial route;

select a subset of the set of modifications by comparing the first set of locations and the second set of locations; and determine a modified route for exposing a plurality of production substrates by modifying the initial route by the selected subset of modifications.

10. A lithographic apparatus having a localized immersion system for confining an immersion liquid to a space between a projection system and a substrate to be exposed by the projection system, the lithographic apparatus configured to perform the method according to claim 1.

11. The computer program product according to claim 9, wherein each of the modifications is associated with at least one of the first locations and wherein the instructions configured to cause the computer to select a subset of the set of modifications are further configured to cause the computer system to select those modifications for which one of the second locations matches an associated one of the first locations.

12. The computer program product according to claim 11, wherein a second location matches a first location if it is within a predetermined distance of the first location.

13. The computer program product according to claim 12, wherein the predetermined distance is in the range of 10 mm to 20 mm.

14. The computer program product according to claim 9, wherein the instructions configured to cause the computer to obtain a set of second locations are further configured to cause the computer system to detect defects in the exposed test substrate and filter out those defects that are not caused by residual liquid.

15. The computer program product according to claim 9, wherein the instructions configured to cause the computer to obtain a set of second locations are further configured to cause the computer system to determine a risk of a defect at each of a plurality of second locations from a plurality of exposed test substrates.

16. The computer program product according to claim 9, wherein the instructions configured to cause the computer to select a subset of the set of modifications are further configured to cause the computer system to determine an expected number of defects prevented by each modification and select one or more modifications associated with the highest expected number of defects prevented.

17. The computer program product according to claim 9, wherein the instructions configured to cause the computer to obtain a set of second locations are further configured to cause the computer system to cause detection of defects using scatterometry.

18. The computer program product according to claim 9, wherein the instructions are further configured to cause the computer system to cause test exposure of at least one test substrate using the initial route to obtain the at least one the exposed test substrate.

19. The computer program product according to claim 9, wherein the instructions are further configured to cause the computer system to cause exposure of a plurality of production substrates according to the modified route.

20. The method according to claim 1, further comprising test exposing at least one test substrate using the initial route to obtain the at least one the exposed test substrate.

* * * * *